(12) United States Patent
Hashimoto et al.

(10) Patent No.: US 6,781,835 B2
(45) Date of Patent: Aug. 24, 2004

(54) AIR-APPLYING DEVICE HAVING A CASE WITH AN AIR INLET PORT, A COOLING UNIT HAVING THE AIR-APPLYING DEVICE, AND AN ELECTRONIC APPARATUS HAVING THE AIR-APPLYING DEVICE

(75) Inventors: Eiji Hashimoto, Tokyo (JP); Tomoshige Uchiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/424,051

(22) Filed: Apr. 25, 2003

(65) Prior Publication Data

US 2004/0123978 A1 Jul. 1, 2004

(30) Foreign Application Priority Data

Dec. 25, 2002 (JP) .................................. PCT/JP02/13529

(51) Int. Cl.⁷ ................................................ H05K 7/20
(52) U.S. Cl. ...................... 361/697; 361/695; 165/80.3; 165/121; 174/16.3; 454/184; 415/177; 415/206
(58) Field of Search ................................ 361/690–695, 361/700; 257/714, 721; 174/16.1, 16.3; 165/80.3, 122; 415/201–206; 417/423.14

(56) References Cited

U.S. PATENT DOCUMENTS

| | | | | |
|---|---|---|---|---|
| 3,824,028 A | * | 7/1974 | Zenkner et al. ............ | 415/58.6 |
| 5,813,834 A | * | 9/1998 | Hopfensperger et al. ... | 415/206 |
| 6,132,170 A | * | 10/2000 | Horng ......................... | 415/178 |
| 6,442,025 B2 | * | 8/2002 | Nakamura et al. ........... | 361/695 |
| 6,587,343 B2 | * | 7/2003 | Novotny et al. ............ | 361/698 |
| 6,643,129 B2 | * | 11/2003 | Fujiwara ..................... | 361/687 |
| 6,654,247 B1 | * | 11/2003 | Lee .............................. | 361/697 |

FOREIGN PATENT DOCUMENTS

| | | |
|---|---|---|
| JP | 54-32806 | 3/1979 |
| JP | 63-128297 | 8/1988 |
| JP | 59-105999 | 6/1994 |
| JP | 6-193597 | 7/1994 |
| JP | 9-126193 | 5/1997 |
| JP | 10-196596 | 7/1998 |
| JP | 10-326986 | 12/1998 |
| JP | 2001-57493 | 2/2001 |
| JP | 2002-98096 | 4/2002 |
| JP | 2002-106497 | 4/2002 |

\* cited by examiner

Primary Examiner—Boris Chérvinsky
(74) Attorney, Agent, or Firm—Foley & Lardner LLP

(57) ABSTRACT

An air-applying device has an impeller having a center of rotation, and a case which contains the impeller. The case includes a first edge defining an inlet port of air which exposes the center of rotation, a second edge defining an outlet port of air, and a high-pressure region which presents upon operational rotation of said impeller. The high-pressure region is located within the case along a peripheral portion of the impeller. A distance between the center of rotation of the impeller and the first edge is shorter in the direction from the center of rotation to a center of the high-pressure region than from the center of rotation to region other than the high-pressure region.

10 Claims, 8 Drawing Sheets

AIR-APPLYING DEVICE HAVING A CASE WITH AN AIR INLET PORT, A COOLING UNIT HAVING THE AIR-APPLYING DEVICE, AND AN ELECTRONIC APPARATUS HAVING THE AIR-APPLYING DEVICE

CROSS-REFERENCE TO RELATED APPLICATIONS

This application is based upon and claims the benefit of priority from PCT International Application No. PCT/JP02/13529, filed Dec. 25, 2002, the entire contents of which are incorporated herein by reference.

BACKGROUND OF THE INVENTION

1. Field of the Invention

This invention relates to a air-applying device for applying, from the periphery of an impeller, the air that has been drawn into the center of an impeller. The invention also relates to a cooling unit having such an air-applying device, and to an electronic apparatus, e.g., a portable computer, which contains such an air-applying device.

2. Description of the Related Art

Electronic apparatuses, such as portable computers, incorporate a microprocessor. The microprocessor generates heat while operating. The heat it generates increases with faster processing (clock) speeds and with the number of functions performed. A conventional electronic apparatus incorporates a cooling unit that positively cools the microprocessor.

The cooling unit is provided, along with the microprocessor, in the housing of the electronic apparatus. The cooling unit includes a heat sink and a centrifugal air-applying device. The heat sink is thermally connected to the microprocessor. The air-applying device applies cooling air to the heat sink. The air-applying device has an impeller and a case containing the impeller. The impeller may be rotated. The case has an air inlet port, a spiral chamber, and an air outlet port. The air inlet port opens to the center of rotation of the impeller. The spiral chamber surrounds the impeller. The air outlet port lies at the output end of the spiral chamber, or the downstream end thereof.

When the impeller is rotated, air is drawn to the center of rotation of the impeller from the interior of the housing or from outside the housing and flows to the periphery of the impeller. The air is then applied from the periphery of the impeller into the spiral chamber, by virtue of a centrifugal force. The spiral chamber is designed to convert the velocity energy of the air applied from the impeller, into pressure energy. In the chamber, the impeller collects the air and blows the air to the air outlet port. Through the air outlet port, the air is forced onto the heat sink, acting as cooling air. As a result, the heat is radiated from the microprocessor, thanks to the heat exchange between the microprocessor and the cooling air. The heat is expelled from the housing as the air flows from the housing.

In the air-applying device, the air flows from the periphery of the impeller into the spiral chamber, is collected in the chamber and supplied to the air outlet port. Therefore, the air pressure in the spiral chamber gradually increases from the input end of the chamber to the output end of the chamber. The air pressure abruptly falls at a position immediately before the outlet port. Hence, the chamber has a high-pressure region near its output end.

In the conventional air-applying device, the air inlet port, which has a perfectly circular cross section, is coaxial with the impeller and communicates with the spiral chamber. (See FIG. 10) Thus, the air in the chamber at a position that corresponds to the above-mentioned high-pressure region, may acquire a higher pressure than the air at the inlet port. If so, part of the air in the spiral chamber abruptly flows from the chamber and through the air inlet port. In other words, the air in the chamber leaks to the air inlet port of the case and may not be reliably guided from the air inlet port to the air outlet port.

Japanese Patent Application Publication (KOKAI) No. 10-326986 discloses a fan device in which air is prevented from abruptly flowing from the case to and through the air inlet port. In this fan device, a ring surrounds the impeller, guiding air to prevent an abrupt flow of air.

In the prior-art fan device, however, a ring that rotates together with the impeller and a structure that secures this ring to the blades of the impeller are necessary.

Inevitably, the impeller is complex in structure and composed of a large number of components. This increases the manufacturing cost of the fan device.

BRIEF SUMMARY OF THE INVENTION

Embodiments of the present invention provide an air-applying device used in a cooling unit and/or an electronic apparatus having a heat generating component.

According to an embodiment of the present invention, an air-applying device has an impeller having a center of rotation, and a case which contains the impeller. The case includes a first edge defining an inlet port of air which exposes the center of rotation, a second edge defining an outlet port of air, and a high-pressure region which presents upon operational rotation of said impeller. The high-pressure region is located within the case along a peripheral portion of the impeller. A distance between the center of rotation of the impeller and the first edge is shorter in the direction from the center of rotation to a center of the high-pressure region than from the center of rotation to region other than the high-pressure region.

According to the other embodiment of the present invention, an air-applying device includes an impeller having a center of rotation, and a case which contains the impeller. The case has a wall defining a chamber with an initiating point, a midpoint, and a terminating point defined in order along a rotating direction of the impeller. The case also has a first edge defining an inlet port of air which exposes the center of rotation, and a second edge defining an outlet port of air. A distance between the center and the first edge is variable, and the shortest distance falls within an angular region of the chamber between the midpoint and the terminating point.

Additional features and advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Preferred embodiments according to the present invention will be described hereinafter with reference to the accompanying drawings.

Figure 1:
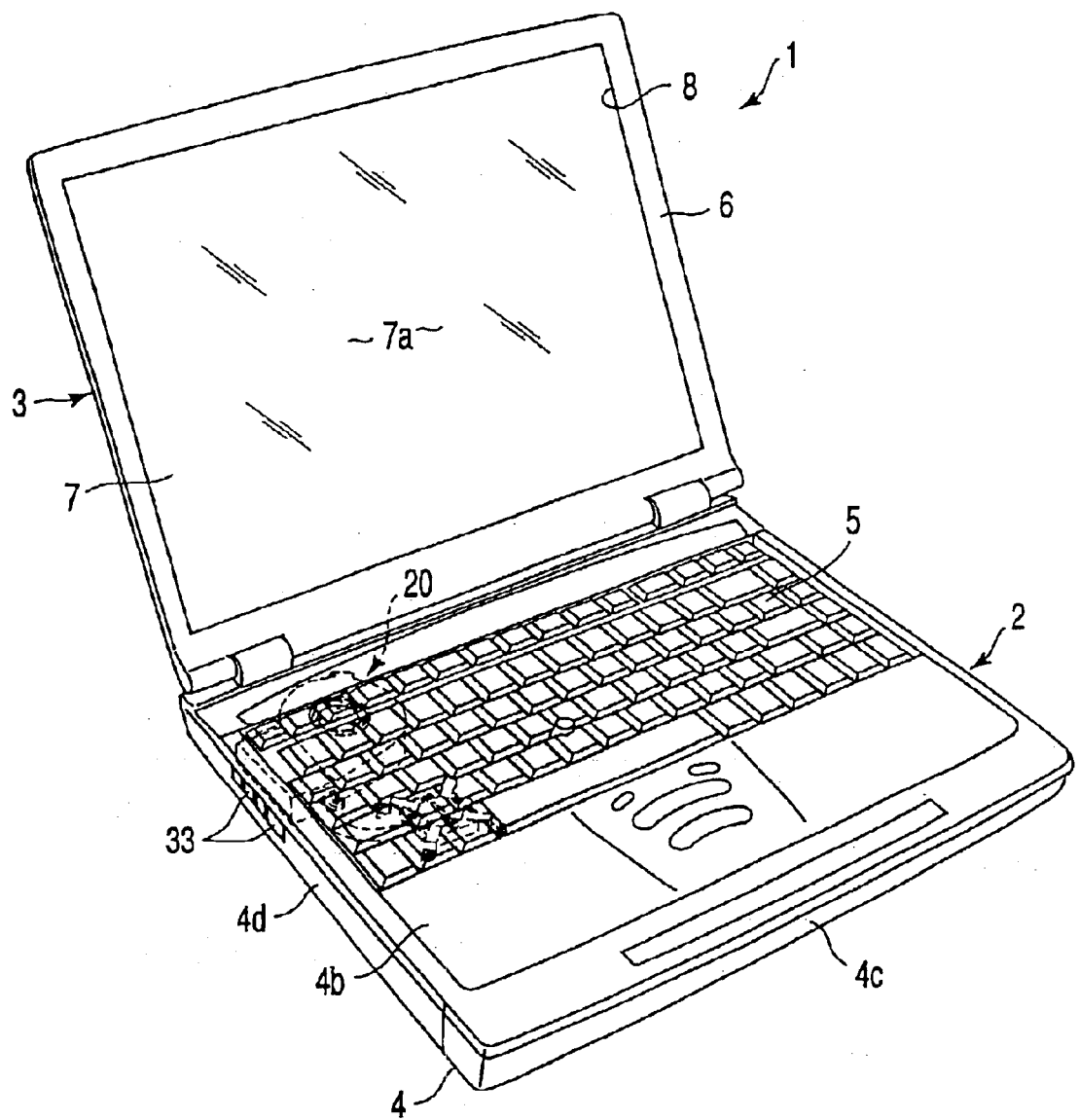
FIG. 1 is a perspective view showing a portable computer according to a first embodiment of the present invention.
Figure 2:
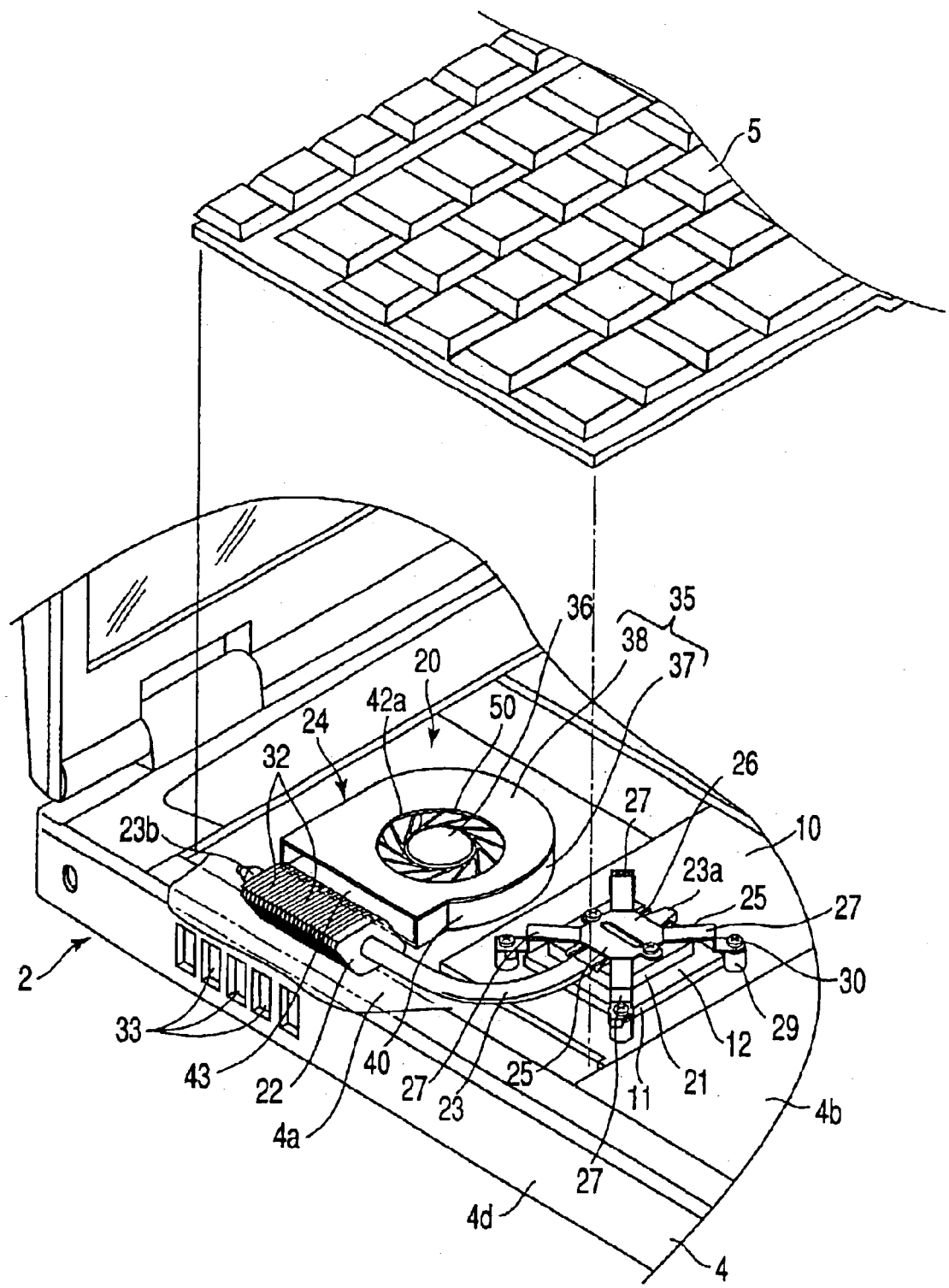
FIG. 2 is a perspective view showing a positional relationship between a housing and a cooling unit in the first embodiment.

FIGS. 1 and 2 show a portable computer 1 as an electronic apparatus. The portable computer 1 includes a main unit 2 and a display unit 3 supported on the main unit 2.

The main unit 2 has a housing 4 shaped in the shape of a flat box. The housing 4 includes a bottom wall 4a, a top wall 4b, a front wall 4c and two sidewalls 4d. The main unit 2 further has a keyboard 5, which is mounted on the top wall 4b.

The display unit 3 includes a display housing 6 and a liquid-crystal display panel 7. The display panel 7 is set in the display housing 6. Hinges (not shown) couples the display housing 6 to the rear edge of the housing 4, allowing the display housing 6 to rotate. The liquid-crystal display panel 7 has a display screen 7a. The display screen 7a is exposed through an opening 8 that is made in the front of the display housing 6.

Figure 3:
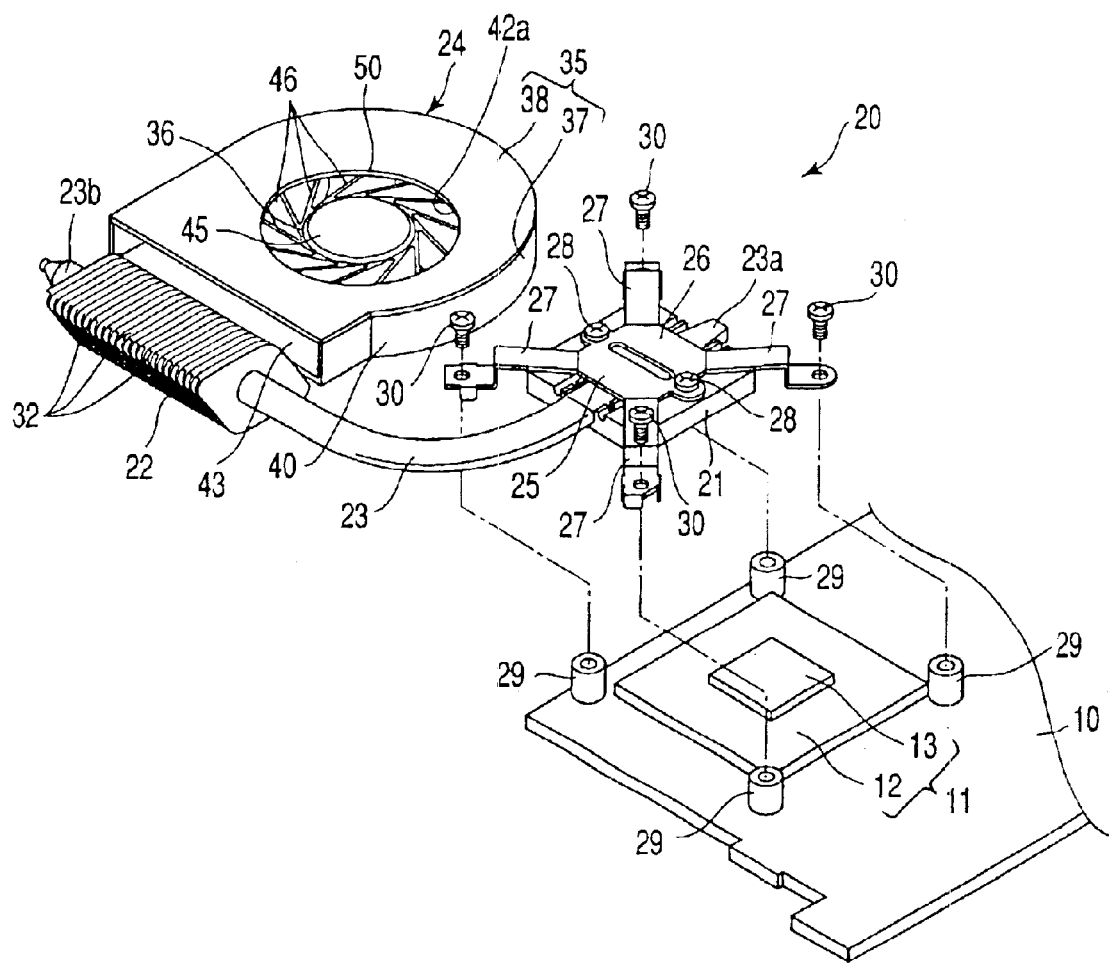
FIG. 3 is a perspective view showing a positional relationship between a CPU and the cooling unit in the first embodiment.

As shown in FIGS. 2 and 3, the housing 4 contains a printed circuit board 10 and a cooling unit 20, the printed circuit board 10 extends along the bottom wall 4a of the housing 4. A semiconductor package 11 as a heat generating component is mounted on the upper surface of the printed circuit board 10. The semiconductor package 11 is the main component of the portable computer 1, and has a base substrate 12 and an IC chip 13, such as a CPU. The base substrate 12 is soldered to the upper surface of the printed circuit board 10. The IC chip 13 is mounted to the center part of the upper surface of the base substrate 12. While operating, the IC chip 13 generates heat in great quantities. The package 11 needs therefore to be cooled to keep operating in stable conditions.

Figure 4:
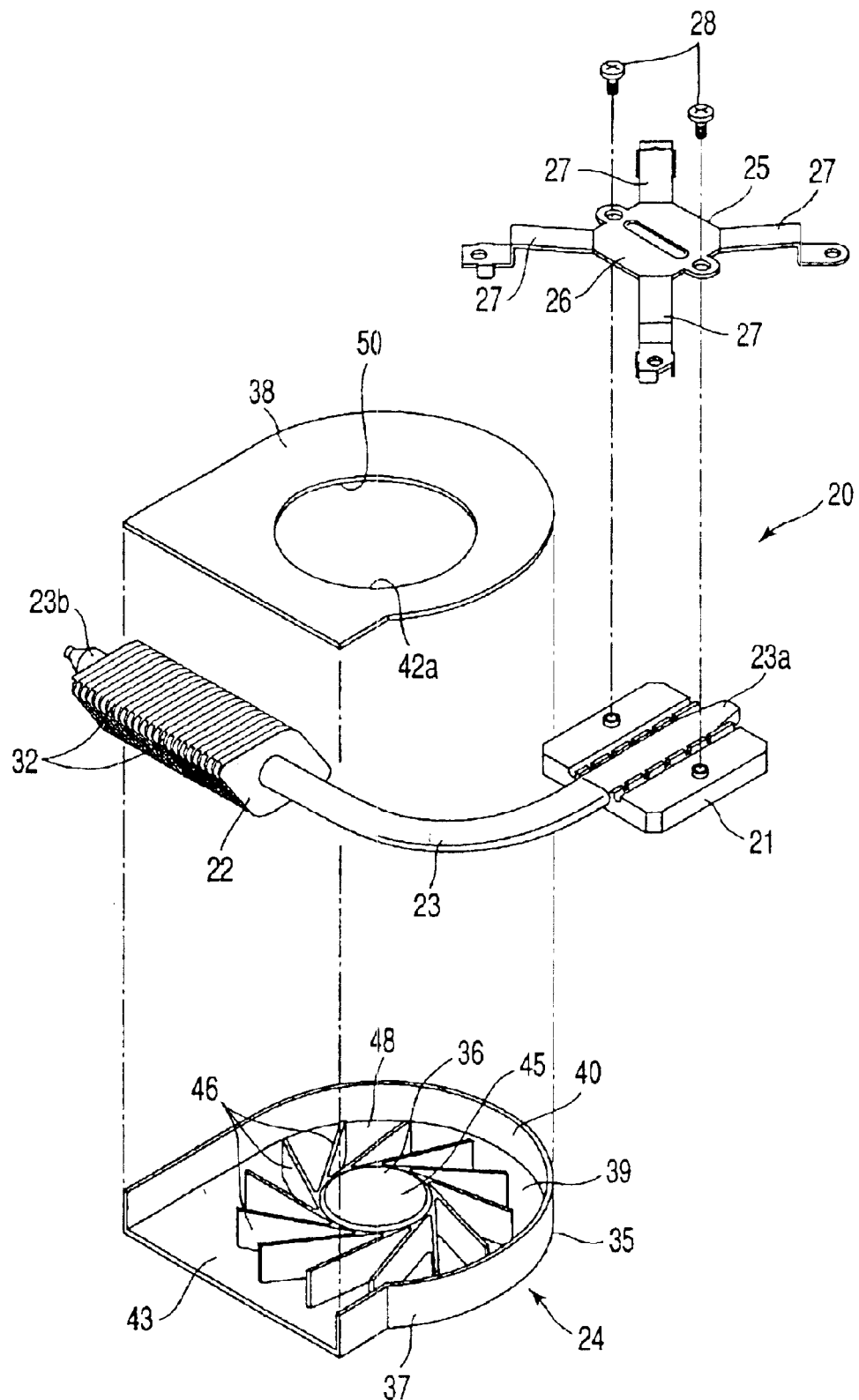
FIG. 4 is an exploded perspective view showing the cooling unit in the first embodiment.

The cooling unit 20 is a component for cooling the semiconductor package 11. As shown in FIGS. 2 to 4, the cooling unit 20 includes a heat-receiving block 21, a heat sink 22, a heat pipe 23, and a centrifugal air-applying device 24.

The heat-receiving block 21 is somewhat larger than the IC chip 13. A spring member 25 secures the heat-receiving block 21 to the printed circuit board 10.

The spring member 25 has a pushing plate 26 and four legs 27. Screws 28 fasten the pushing plate 26 to the upper surface of the heat-receiving block 21. The legs 27 extend in radial direction from the four corners of the plate 26. Screws 30 fasten the legs 27, at their distal ends, to the four bosses 29 of the printed circuit board 10. The legs 27 act as springs, biasing the heat-receiving block 21 toward the semiconductor package 11, the block 21 being secured to the pushing plate 26. The heat-receiving block 21 is therefore is contact with and biased against the IC chip 13 and, hence, thermally connected to the IC chip 13.

The heat sink 22 has a number of heat-radiating fins 32. The heat sink 22 extends along the left sidewall 4d of the housing 4, and opposes the exhaust port 33 made in this sidewall 4d.

The heat pipe 23 is thermally connected at one end 23a to the heat-receiving block 21, and at the other end 23b to the heat sink 22. Therefore, the heat radiated from the IC chip 13 is transmitted to the heat-receiving block 21 and then transferred to the heat sink 22 via the heat pipe 23.

As shown in FIGS. 3 to 6, the centrifugal air-applying device 24 includes a case 35 and an impeller 36. The case 35 is in the shape of a flat box and contains the impeller 36. The case 35 is composed of a case body 37 and a cover 38. The case body 37 has a bottom plate 39 and a sidewall 40. The sidewall 40 stands from the circumference of the bottom plate 39. Both the cover 38 and the bottom plate 39 are shaped like a disc and constitute the outer walls of the case 35. The sidewall 40 is bent like an arc, constituting the circumferential wall of the case 35. The cover 38 is fixed to the upper edge of the sidewall 40 and opposes the bottom plate 39 of the case body 37.

The case 35 has two round inlet ports 42a and 42b and one outlet port 43. One inlet port 42a is defined by an edge cut in the center part of the cover 38, and the other inlet port 42b is defined by an edge cut in the center part of the bottom plate 39. A motor support 44, which is shaped like a disc, lies inside the inlet port 42b. The inlet ports 42a and 42b oppose each other, spaced apart in the direction of thickness of the case 35. The outlet port 43 opens in the sidewall 40 of the case body 37, and defined by edges cut in the cover 38, the bottom plate 39, and the sidewall 40. The shape of the outlet port 43 is oblong, extending along the diameter of the case 35.

The case 35 lies on the bottom wall 4a of the housing 4, with the outlet port 43 oriented to the exhaust port 33 of the housing 4. Thus, the heat sink 22 is positioned, opposing the outlet port 43 of the case 35, and is interposed between the outlet port 43 and the exhaust port 33.

The impeller 36 has a boss 45 and a plurality of vanes 46. The boss 45 is a hollow cylinder. The vanes 46 protrude from the circumference of the boss 45, each extending along a tangent to the circumference of the boss 45. The impeller 36 lies between the cover 38 and bottom plate 39 of the case 35. The roots of the vanes 46 oppose the inlet ports 42a and 42b, and are exposed therethrough.

Figure 5:
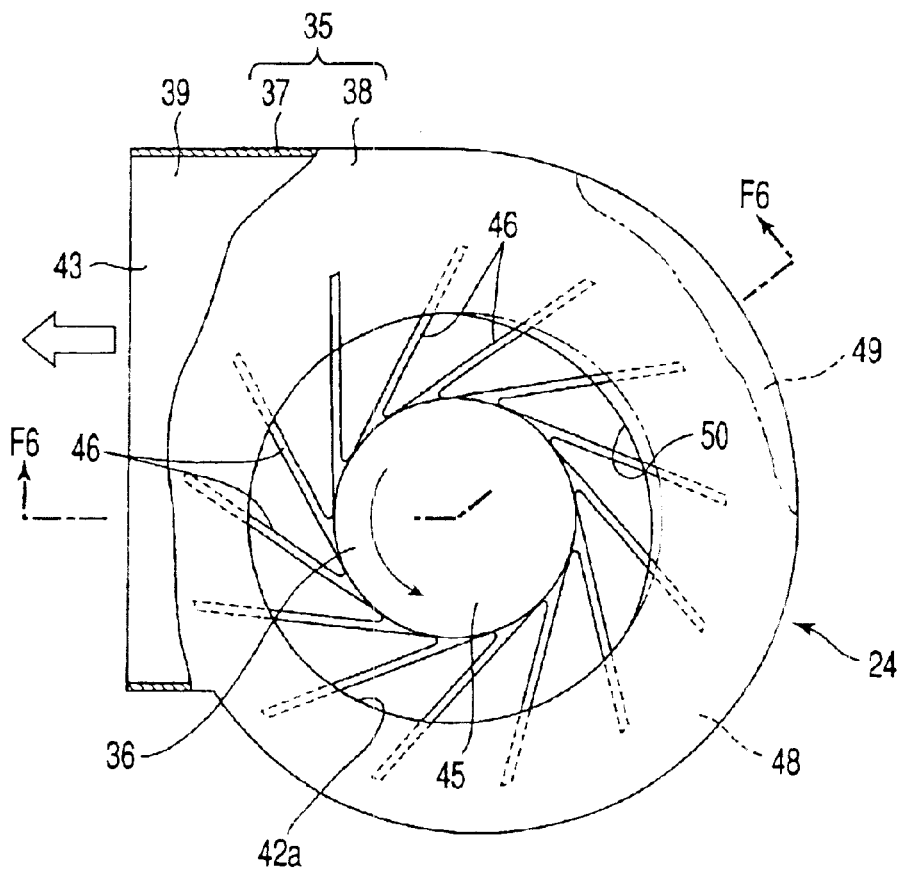
FIG. 5 is a plan view showing a air-applying device in the first embodiment.

The impeller 36 is coupled to a motor 47, which is secured to the motor support 44. The motor 47 may rotate the impeller 36 counter-clockwise as shown in FIGS. 5 and 7. When the impeller 36 is so rotated, a negative pressure develops in the inlet ports 42a and 42b. Air is therefore drawn from outside the case 35, toward the center of the impeller 36 through the inlet ports 42a and 42b as indicated by the arrow in FIG. 6. The air thus drawn is forced to the circumference of the impeller 36 by virtue of a centrifugal force.

Figure 6:
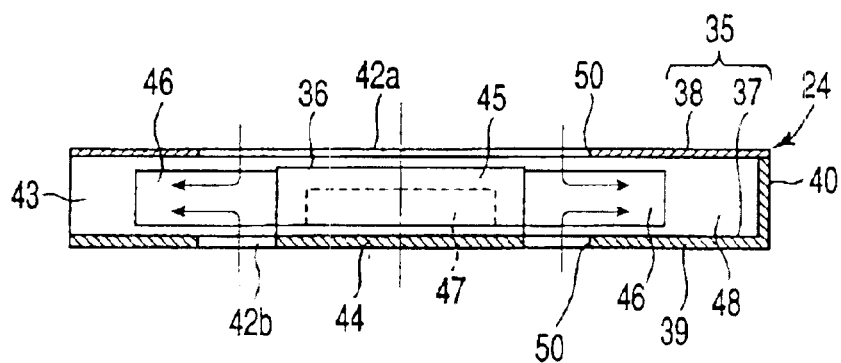
FIG. 6 is a cross-sectional view cut along the line F6—F6 shown in FIG. 5.
Figure 7:
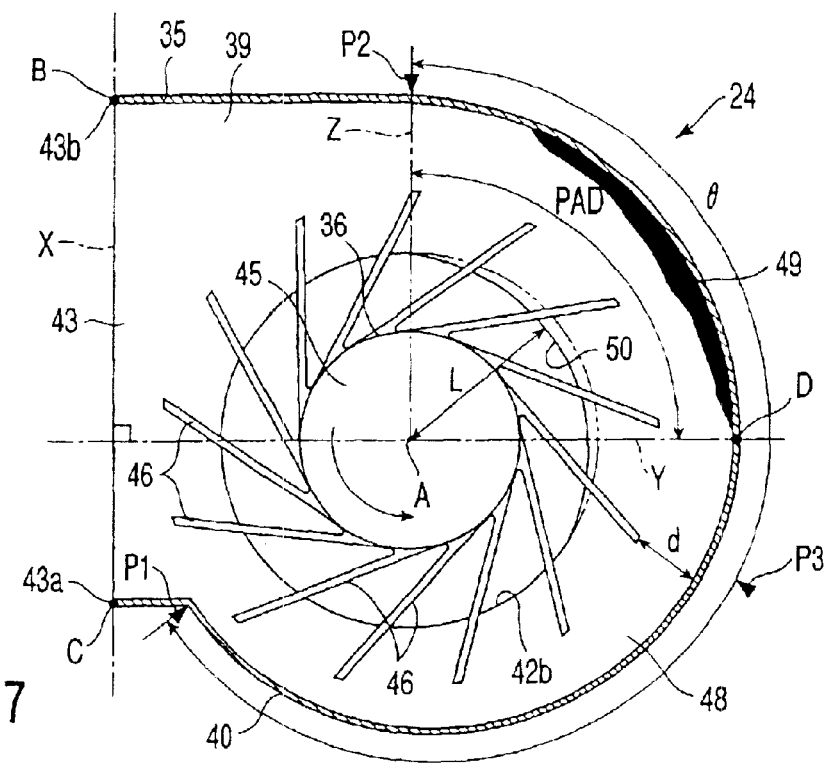
FIG. 7 is a cross-sectional view of the air-applying device, illustrating the position relation between the shape of the air inlet port and the high-pressure region where the air attains the highest pressure in the first embodiment.

As FIGS. 4 to 6 show, the case 35 has a spiral chamber 48 that surrounds the impeller 35. The spiral chamber 48 is configured to collect the air applied from the circumference of the impeller 36 and guides the air toward the outlet port 43. It has the function of converting the velocity energy of the air into pressure energy. The shape of the spiral chamber 48 is defined by the sidewall 40 of the case body 37. The sidewall 40 surrounds the impeller 36.

As shown in FIG. 7, the spiral chamber 48 has an initiating point P1 and a terminating point P2. The initiating point P1 is adjacent to one end 43a of the outlet port 43. The terminating point P2 deviates from the initiating point P1, by a preset angle θ, in the rotation direction of the impeller 36. The other end 43b, which extends along the outlet port 43, is located on a line extending from the terminating point P2.

The distance d between the sidewall 40 and the circumference of the impeller 36 is the shortest at the initiating point P1 and gradually increases from the point P1 toward the terminating point P2.

Figure 8:
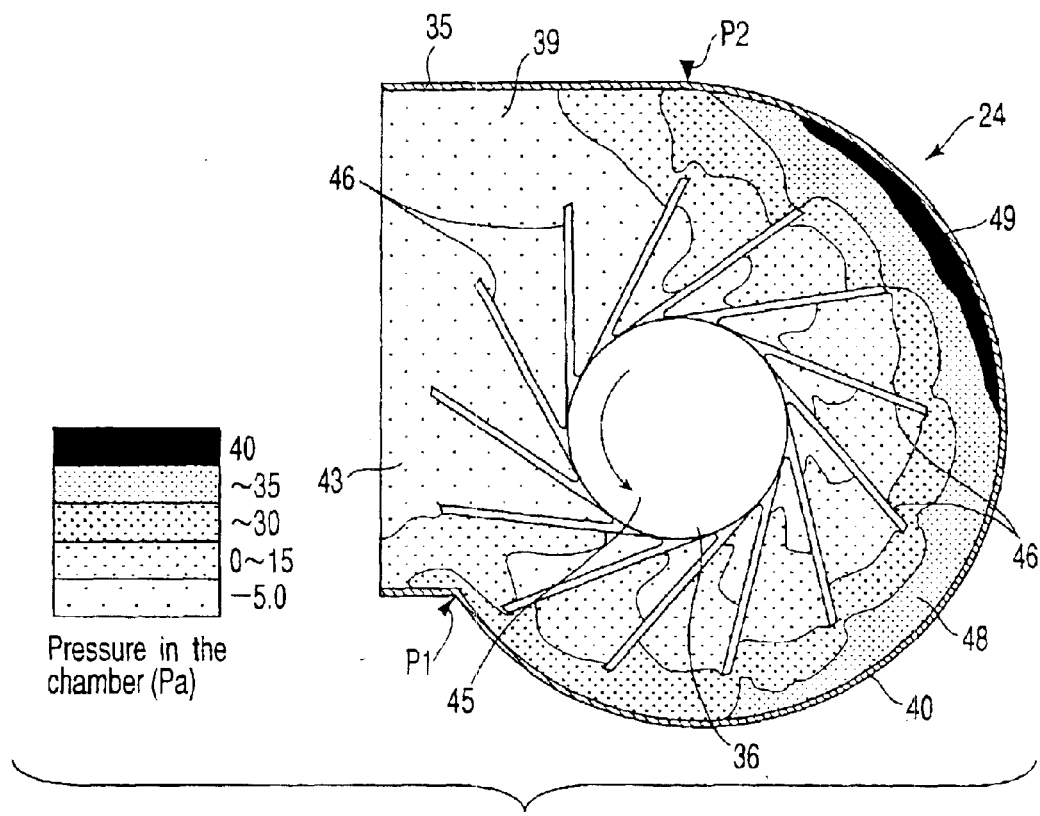
FIG. 8 is a cross-sectional view of the air-applying device, showing the pressure distribution in the case in the first embodiment.

FIG. 8 represents the pressure distribution that is observed in the case 35 while the impeller 36 is rotating. As is evident from FIG. 8, the air pressure (Pa) in the case 36 is lowest at the roots of the vanes 46, which are close to the center of the impeller 36, and also at the position near the outlet port 43. The air pressure gradually rises from the initiating point P1 toward the terminating point P2, in the rotation direction of the impeller 36.

The air pressure (Pa) in the case 35 increases toward the sidewall 40 that is located at the outermost part of the spiral chamber 48. The high-pressure region 49, where the air pressure (Pa) reaches its peak, lies closer to the terminating point P2 than the midpoint P3 and between the points P2 and P3.

The high-pressure region 49, which is defined by the positional relation between the case 35 and the impeller 36, is illustrated in FIG. 7. In FIG. 7, point A is the center of rotation of the impeller 36, point B is the position of the other end 43b of the outlet port 43, point C is the position of the one end 43a of the outlet port 43. Line X connects points B and C, line Y passes point A and intersects with the line X at right angles, line Z connects point A and the terminating point P2 of the spiral chamber 48, and point D is the intersection of line Y and the sidewall 40. The high-pressure region 47 is region PAD that is defined by the terminating point P2, point A and point D. The region PAD lies, with one end reaching terminating point P2 and the other end located at some distance from the midpoint P3 of the spiral chamber 48.

Two projections 50 are provided on the edges of the inlet ports 42a and 42b, respectively. Both projections 50, which are shaped like an arc, protrude toward the center of rotation (i.e., point A) of the impeller 36. The edge of either inlet port is circular and lies coaxial with the impeller 36, except at the projection 50.

The inlet ports 42a and 42b have a curvature that changes at the high-pressure region 49, due to the projections 50. Neither the inlet port 42a nor the inlet port 42b has a perfectly circular cross section.

As seen from FIG. 7, either edge of projection 50 protrudes toward the center of rotation (point A) of the impeller 36, to the greatest extent at its middle part. In other words, the distance L between the middle part of either edge of projection 50 and the center (point A) is shorter than the distance between any other part of the projection 50 and the center (point A). The projections 50 arranged on the cover 38 and the bottom plate 39 are at the positions corresponding to the spiral chamber between the midpoint P3 and the terminating point P2. The high-pressure region 49 lies on the line connecting the midpoint of the projection 50 and the center of rotation (point A) of the impeller 36.

Figure 9:
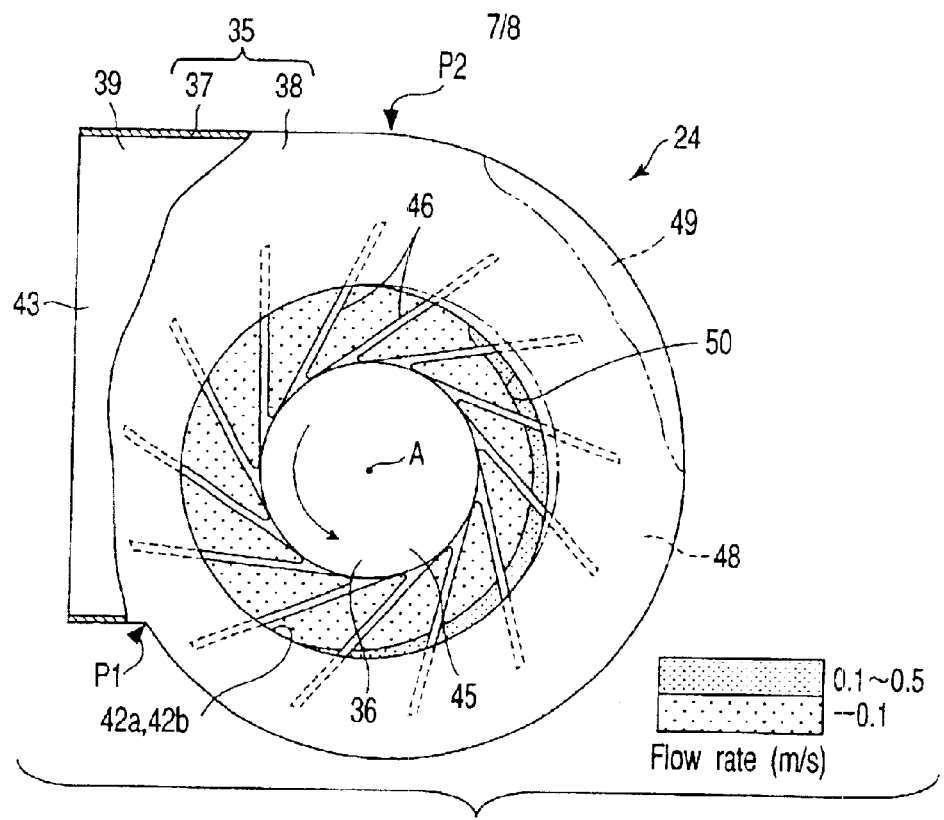
FIG. 9 is a plan view of the air-applying device, showing the air flow-rate distribution in an air inlet port formed into a non-circular opening in the first embodiment.
Figure 10:
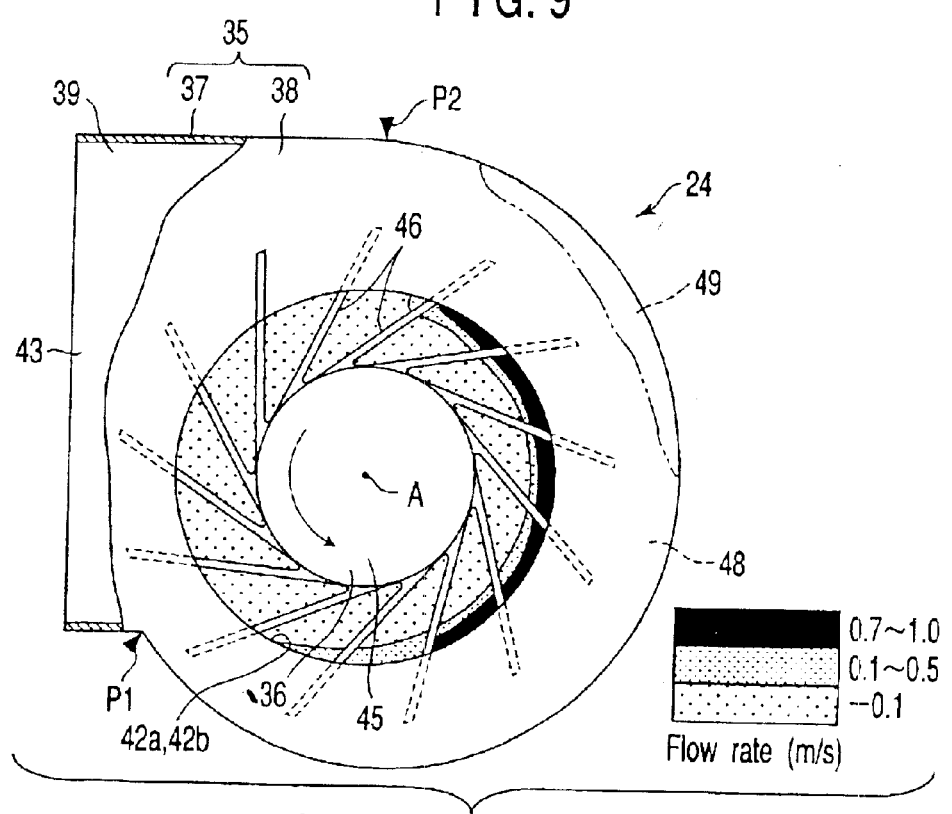
FIG. 10 is a plan view of a conventional air-applying device, showing the air flow-rate distribution in an air inlet port formed into a perfectly circular opening arranged coaxial with an impeller.

FIG. 9 illustrates the flow-rate distribution of the air flowing through the inlet ports 42a and 42b of the centrifugal air-applying device 24, which have a non-circular opening. FIG. 10 shows the flow-rate distribution of the air flowing through a conventional inlet port, which corresponds to the inlet ports 42aand 42b and which is formed into a perfect circle and coaxial with the impeller 36.

As shown in FIG. 9, air flows at positive pressure in that region of either inlet port 42a or 42b, which extends from the middle part of the projection 50 to near the initiating point P1 of the spiral chamber 48. In the remaining region of either inlet port, air flows at negative pressure. Thus, the air is drawn to the center of rotation of the impeller 36.

As shown in FIG. 10, air flows partly at positive pressure, along that part of the rim of either inlet port 42a or 42b, which extends from a point near the terminating point P2 of the spiral chamber 48 to the initiating point P1 thereof.

In the centrifugal air-applying device 24 shown in FIG. 9, part of the air flowing through the inlet ports 42a and 42b that are formed into a non-circular shape acquires a positive pressure. Nonetheless, its flow rate falls within the range of 0.1 to 0.5 m/s. In the centrifugal air-applying device 24 shown in FIG. 10, wherein the inlet ports 42a and 42b are formed into a perfect circle, that part of air which has a positive pressure flows through the ports 42a and 42b at a rate ranging from 0.4 to 1.0 m/s. Obviously, this flow rate is higher than in the device of FIG. 9. In addition, the range of flow rate of the air flowing at the positive pressure is broader than in the device illustrated in FIG. 9.

As seen from the above, the inlet ports 42a and 42b, each being formed into a non-circular shape, reduce both the flow rate of the air flowing at a positive pressure and the flow-rate range thereof.

This may be because those parts of the edges of the inlet ports 42a and 42b, which correspond to the high-pressure region 49, are spaced away from the high-pressure region 49 due to the projections 50.

Namely, air is prevented from leaking from the inlet ports 42a and 42b in the first embodiment, by changing the opening shapes of the inlet ports 42a and 42b. The structure of the impeller 36 is not changed and is not complicated. Nor will the number of component increase. The centrifugal air-applying device 24 may yet be provided at a low cost and, hence, at a low price.

Moreover, air may be efficiently guided from the inlet ports 42a and 42b to the outlet port 43. As a result, the efficiency of cooling the heat sink 22 that opposes the outlet port 43 rises, making it possible to enhance the cooling of the semiconductor package 11.

In the first embodiment, a part of the edge of either inlet port projects toward the center of rotation of the impeller, rendering the shape of the inlet port non-circular. Nevertheless, this invention is not limited to this feature.

For instance, the inlet port may have a perfectly circular opening coaxial with the impeller. If this is the case, leakagepreventing sheets may be laid on the cover and bottom plate of the case having the inlet ports, thus forming the projected edge parts of the inlet ports, which correspond to the high-pressure region of the spiral chamber.

In this arrangement, the sheets function as a projected edge such that the edge (i.e., projected edge) of the inlet ports is closer toward the center of rotation of the impeller. The sheets make both inlet ports effectively have a non-circular opening. The sheets prevent the air from leaking at the inlet ports, as the projections do in the first embodiments.

Figure 11:
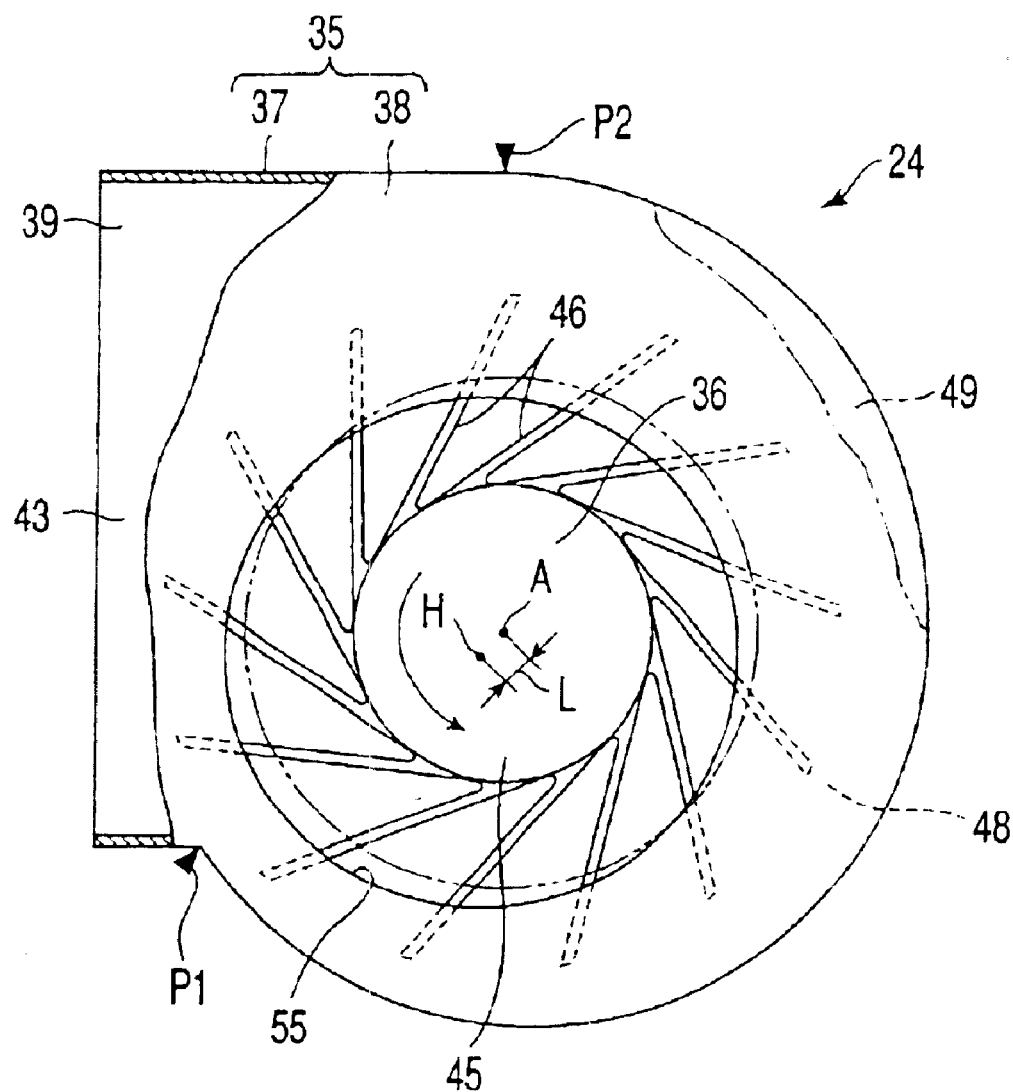
FIG. 11 is a plan view of an air-applying device according to a second embodiment of the present invention.

FIG. 11 depicts the second embodiment of the present invention.

The second embodiment differs from the first in the shape of inlet ports 55. It is basically the same in other structural aspects as the first embodiment. The components identical to those of the first embodiment are designated at the same reference numerals and will not be described.

As shown in FIG. 11, the cover 38 has an inlet port 55, and the bottom plate (not shown) also has an inlet port. The inlet ports 55 have a perfectly circular opening and lie coaxial with each other. The inlet ports 55 are eccentric to the center of rotation (point A) of the impeller 36, with their centers located away from the high-pressure region 49 of the spiral chamber 48.

The center H of each inlet port 55 deviates, by a distance L, from the center of rotation (point A) of the impeller 36. Thus, that part of the edge of either inlet port 55, which corresponds to the high-pressure region 49, projects toward the center of rotation (point A) of the impeller 36.

In this arrangement, the inlet ports 55 are eccentric to the impeller 36. Therefore, that edge part of either inlet port 55, which corresponds to the high-pressure region 49, protrudes away from the high-pressure region 49.

Thus, air may be prevented from leaking at the inlet ports 55, by positioning the inlet ports 55 eccentric to the impeller 36. This contributes to the reduction of cost.

Electronic apparatuses according to the present invention are not particularly limited to portable computers. The present invention is applicable to various data processing apparatuses each including a circuit component that generates heat.

It may be seen that an embodiment of the invention may be characterized as a method of making an air-applying device includes the steps of positioning an impeller within a casing having an inlet and an outlet ports, and configuring one of the shape of the inlet port and the orientation of the inlet port with respect to the center of rotation of the impeller, such that leakage flow of air from within the casing to outside the casing through the inlet port is inhibited. It is understood that inhibiting the air flow as mentioned above need not result in complete prevention of all leakage air but may reduce such leakage air as compared to the prior art (FIG. 10).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An air-applying device, comprising:
   an impeller having a center of rotation; and
   a case which contains said impeller, said case having:
   (1) a first edge defining an inlet port of air which exposes the center of rotation of said impeller,
   (2) a second edge defining an outlet port of air, and
   (3) a high-pressure region which presents upon operational rotation of said impeller, the high-pressure region located within the case along a peripheral portion of said impeller,
   wherein a distance between the center of rotation of said impeller and the first edge is shorter in the direction from the center of rotation to a center of the high-pressure region than from the center of rotation to regions other than the high-pressure region, and the first edge is formed such that the inlet port has a non-circular shape.

2. An air-applying device according to claim 1, wherein said case has a wall defining a chamber which surrounds said impeller, collects the air applied from the outer circumference of said impeller and guides the air to the outlet port, and the high pressure region is located in the chamber.

3. An air-applying device according to claim 2, wherein the chamber has an initiating point, a midpoint, and a terminating point in a direction of rotation of the impeller, and the high-pressure region in the case being between the midpoint and the terminating point.

4. An air-applying device according to claim 1, wherein the case includes a pair of walls opposing each other across the impeller, and each of the walls has the first edge.

5. A cooling unit, comprising:
   a heat sink thermally connected to a heat-generating component; and
   an air-applying device including an impeller having a center of rotation, and a case which contains said impeller, said case having:
   (1) a first edge defining an inlet port of air which exposes the center of rotation of said impeller,
   (2) a second edge defining an air outlet port opposing to said heat sink, and
   (3) a high-pressure region, present upon operational rotation of said impeller, the high-pressure region located within said case along a peripheral portion of said impeller,
   wherein a distance between the center of rotation of said impeller and the first edge is shorter in the direction from the center of rotation to a center of the high-pressure region than from the center of rotation to regions other than the high-pressure region, and the first edge is formed such that the inlet port has a non-circular shape.

6. A cooling unit according to claim 5, wherein the case has a wall defining a chamber which surrounds the impeller, collects the air applied from the outer circumference of the impeller and guides the air to the outlet port, and the high pressure region is located in the chamber.

7. An electronic apparatus, comprising:
   a housing which has a heat-generating component;
   a heat sink thermally connected to the heat-generating component; and
   an air-applying device including an impeller having a center of rotation, and a case which contains said impeller, said case having:
   (1) a first edge defining an inlet port of air which exposes the center of rotation of said impeller,
   (2) a second edge defining an air outlet port opposing to the heat sink, and
   (3) a high-pressure region which presents upon operational rotation of said impeller, the high-pressure region located within the case along a peripheral portion of said impeller, wherein a distance between the center of rotation and the first edge is shorter in the direction from the center of rotation to a center of the high-pressure region than from the center of rotation to regions other than the high-pressure region, and the first edge is formed such that the inlet port has a non-circular shape.

8. An electronic apparatus according to claim 7, wherein the case has a wall defining a chamber which surrounds the impeller, collects the air applied from the outer circumference of the impeller and guides the air to the outlet port, and the high pressure region is located in the chamber.

9. An air-applying device, comprising:

an impeller having a center of rotation; and a case which contains the impeller, the case having,
- a wall defining a chamber with an initiating point, a midpoint, and a terminating point defined in order along a rotating direction of said impeller,
- a first edge defining an inlet port of air which exposes the center of rotation, and
- a second edge defining an outlet port of air, wherein a distance between the center and the first edge is variable, and the shortest distance falls within an angular region of the chamber between the midpoint and the terminating point, and the first edge is formed such that the inlet port has a non-circular shape.

10. An air-applying device, comprising:

an impeller having a center of rotation; and a case which contains said impeller, said case having:

(1) a first edge defining an inlet port of air which exposes the center of rotation of said impeller, (2) a second edge defining an outlet port of air, and (3) a high-pressure region which presents upon operational rotation of said impeller, the high-pressure region located within the case along a peripheral portion of said impeller, wherein the first edge of said case has a shape and orientation with respect to the center of rotation such that air escaping outside said case from the inlet port is reduced as compared with a first edge having circular shape and being oriented concentric to said center of rotation, and the first edge is formed such that the inlet port has a non-circular shape.

* * * * *